United States Patent
Suh et al.

(10) Patent No.: US 9,780,130 B2
(45) Date of Patent: Oct. 3, 2017

(54) IMAGE SENSOR AND IMAGE PROCESSING SYSTEM INCLUDING THE SAME

(71) Applicant: SAMSUNG ELECTRONICS CO., LTD., Suwon-si (KR)

(72) Inventors: Sung Dong Suh, Seoul (KR); Masaru Ishii, Hwaseong-si (JP); Sung Young Yun, Suwon-si (KR); Sang Chul Sul, Suwon-si (KR); Yong Wan Jin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 33 days.

(21) Appl. No.: 14/744,802

(22) Filed: Jun. 19, 2015

(65) Prior Publication Data
US 2015/0372036 A1    Dec. 24, 2015

(30) Foreign Application Priority Data
Jun. 20, 2014 (KR) .................... 10-2014-0075467

(51) Int. Cl.
*H01L 27/146* (2006.01)
*H01L 27/30* (2006.01)

(52) U.S. Cl.
CPC .... *H01L 27/14621* (2013.01); *H01L 27/1462* (2013.01); *H01L 27/1464* (2013.01); *H01L 27/14609* (2013.01); *H01L 27/14625* (2013.01); *H01L 27/14627* (2013.01); *H01L 27/14636* (2013.01); *H01L 27/14643* (2013.01); *H01L 27/14665* (2013.01); *H01L 27/1463* (2013.01); *H01L 27/307* (2013.01)

(58) Field of Classification Search
CPC ............ H04N 2209/045; H04N 9/045; H04N 5/3537; H04N 2209/047; H01L 27/14621; H01L 27/14627; H01L 27/1463; H01L 27/14636; H01L 27/14667
USPC .................. 348/272, 273, 277–280
See application file for complete search history.

(56) References Cited

U.S. PATENT DOCUMENTS

| | | | |
|---|---|---|---|
| 7,868,937 B2 | 1/2011 | Mizukura et al. | |
| 8,035,708 B2 | 10/2011 | Takizawa et al. | |
| 8,120,680 B2 | 2/2012 | Kim et al. | |
| 8,179,456 B2 | 5/2012 | Kim et al. | |
| 8,481,908 B2 | 7/2013 | Inaba | |
| 2007/0291144 A1* | 12/2007 | Suzuki ............ | H01L 27/14621 348/272 |
| 2010/0123070 A1 | 5/2010 | Natori | |
| 2010/0327384 A1 | 12/2010 | Tomoda | |

(Continued)

FOREIGN PATENT DOCUMENTS

JP   WO 2013164948 A1 * 11/2013  ........... H01L 27/307
KR   10-2013-0014222 A    2/2013

*Primary Examiner* — Nelson D. Hernández Hernández
(74) *Attorney, Agent, or Firm* — Sughrue Mion, PLLC (57) ABSTRACT

An image sensor is provided. The image sensor includes a first photoelectric conversion element and a second photoelectric conversion element, which are formed in a semiconductor substrate; a red color filter formed on the first photoelectric conversion element; a cyan color filter formed on the second photoelectric conversion element; and an organic photoelectric conversion layer formed on the red color filter and the cyan color filter, the organic photoelectric conversion layer configured to absorb wavelengths in a green range.

18 Claims, 7 Drawing Sheets

(56) References Cited

U.S. PATENT DOCUMENTS

| | | | |
|---|---|---|---|
| 2012/0009720 A1* | 1/2012 | Shim | H01L 27/14625 |
| | | | 438/70 |
| 2012/0267745 A1 | 10/2012 | Tsuji | |
| 2013/0307040 A1* | 11/2013 | Ahn | H01L 27/1463 |
| | | | 257/292 |
| 2014/0071316 A1 | 3/2014 | Asano et al. | |
| 2015/0115243 A1* | 4/2015 | Miyanami | H01L 51/448 |
| | | | 257/40 |

* cited by examiner

IMAGE SENSOR AND IMAGE PROCESSING SYSTEM INCLUDING THE SAME

CROSS-REFERENCE TO RELATED APPLICATIONS

This application claims priority under 35 U.S.C. §119(a) from Korean Patent Application No. 10-2014-0075467 filed on Jun. 20, 2014, the disclosure of which is hereby incorporated by reference in its entirety.

BACKGROUND

Exemplary embodiments of the inventive concept relate to an image sensor, and more particularly, to an image sensor for increasing the sensitivity and transmittance of a blue color filter in an image processing system, as well as reducing cross-talk.

An image sensor is a device that converts an optical image into an electrical signal. The image sensor is used in digital cameras and various image processing devices such as a digital camera. Image sensors are divided into charged coupled device (CCD) image sensors and complementary metal-oxide-semiconductor (CMOS) image sensors.

An image sensor includes a plurality of pixels arranged in a matrix. Each of the pixels includes a photoelectric conversion element that converts incident light into electrical signals and a plurality of transistors to read out the electrical signals from the photoelectric conversion element A color image sensor includes a plurality of color filters, e.g., a red color filter, a green color filter, and a blue color filter. Each of the color filters is included in a corresponding pixel. A color filter transmits wavelengths in a certain color range to a photoelectric conversion element included in a corresponding pixel. However, since the color filter itself absorbs a lot of wavelengths in the color range, the photoelectric conversion element cannot satisfactorily and effectively use the wavelengths that have passed through the color filter. In this circumstance, the sensitivity of an image sensor may be reduced.

SUMMARY

Exemplary embodiments provide an image sensor which includes a cyan color filter replacing a blue color filter, thereby enabling a photoelectric conversion element to satisfactorily effectively use wavelengths in the blue range and an image processing system including the same. Exemplary embodiments may also provide an image sensor for increasing sensitivity to the blue range of the visible spectrum and reducing cross-talk and an image processing system including the same.

According to an aspect of an exemplary embodiment, there is provided an image sensor including a first photoelectric conversion element and a second photoelectric conversion element, which are formed in a semiconductor substrate; a red color filter formed on the first photoelectric conversion element; a cyan color filter formed on the second photoelectric conversion element; and an organic photoelectric conversion layer formed on the red color filter and the cyan color filter to absorb wavelengths in a green range.

The image sensor may further include a first oxide film formed on the organic photoelectric conversion layer to have a first refractive index and a second oxide film formed on the first oxide film to have a second refractive index. The first refractive index may be less than the second refractive index.

The first oxide film may be formed of $Al_2O_3$ and the second oxide film may be formed of SiON. The first oxide film and the second oxide film may form a pair and at least two pairs may be stacked.

The image sensor may further include a third oxide film formed on the second oxide film to have the first refractive index. At this time, the first oxide film and the third oxide film may be formed of $SiO_2$ and the second oxide film may be formed of SiON.

The image sensor may further include a planarization layer formed on the organic photoelectric conversion layer and a plurality of oxide films formed between the organic photoelectric conversion layer and the planarization layer. The oxide films may have different refractive indexes. The image sensor may further include a transparent electrode connected to the organic photoelectric conversion layer, a storage node formed in the semiconductor substrate, and a connection circuit configured to connect the transparent electrode with the storage node.

The connection circuit may include a first metal connected to the transparent electrode; a deep trench isolation (DTI) including a conductive plug therein; a second metal; and a plurality of third metals configured to connect the first metal, the conductive plug, the second metal, and the storage node in series to one another. The image sensor may further include a shallow trench isolation (STI) formed between the storage node and the first or second photoelectric conversion element.

The image sensor may further include a DTI formed between the first photoelectric conversion element and the second photoelectric conversion element and an STI formed between the DTI and the second photoelectric conversion element. The DTI may include a conductive plug formed therein. The conductive plug may be formed of polysilicon.

According to another aspect of an exemplary embodiment, there is provided an image processing system including an image sensor configured to output image data and a processor configured to process the image data. The image sensor includes a first photoelectric conversion element and a second photoelectric conversion element, which are formed in a semiconductor substrate; a red color filter formed on the first photoelectric conversion element; a cyan color filter formed on the second photoelectric conversion element; and an organic photoelectric conversion layer formed on the red color filter and the cyan color filter to absorb wavelengths in a green range. The image processing system may further include a camera serial interface configured to transmit the image data from the image sensor to the processor.

The image sensor may further include a transparent electrode connected to the organic photoelectric conversion layer; a first metal connected to the transparent electrode; a DTI including a conductive plug therein; a second metal; a storage node formed in the semiconductor substrate; and a plurality of third metals configured to connect the first metal, the conductive plug, the second metal, and the storage node in series to one another. At least one of the third metals may be formed of tungsten.

According to an aspect of an exemplary embodiment, there is provided an image sensor including a first photoelectric conversion element configured to absorb wavelengths in a red range; a second photoelectric conversion element configured to absorb wavelengths in a blue range; a red color filter formed on the first photoelectric conversion element; a cyan color filter formed on the second photoelectric conversion element; and an organic photoelectric conversion layer formed on the red color filter and the cyan color filter, the organic photoelectric conversion layer configured to absorb wavelengths in a green range.

The image sensor may further include: a first oxide film formed on the organic photoelectric conversion layer, the first oxide film configured to have a first refractive index; and a second oxide film formed on the first oxide film, the second oxide film configured to have a second refractive index.

The first refractive index may be less than the second refractive index.

The first oxide film may include $Al_2O_3$ and the second oxide film may include SiON.

BRIEF DESCRIPTION OF THE DRAWINGS

The above and other features and advantages will become more apparent by describing in detail exemplary embodiments thereof with reference to the attached drawings in which.

DETAILED DESCRIPTION OF THE EXEMPLARY EMBODIMENTS

Exemplary embodiments will now be described more fully hereinafter with reference to the accompanying drawings. Exemplary embodiments may, however, be embodied in many different forms and should not be construed as limiting the disclosure set forth herein. Rather, the exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be understood that when a layer is referred to as being "on" another layer or substrate, it can be directly on the other layer or substrate, or intervening layers may also be present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular exemplary embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
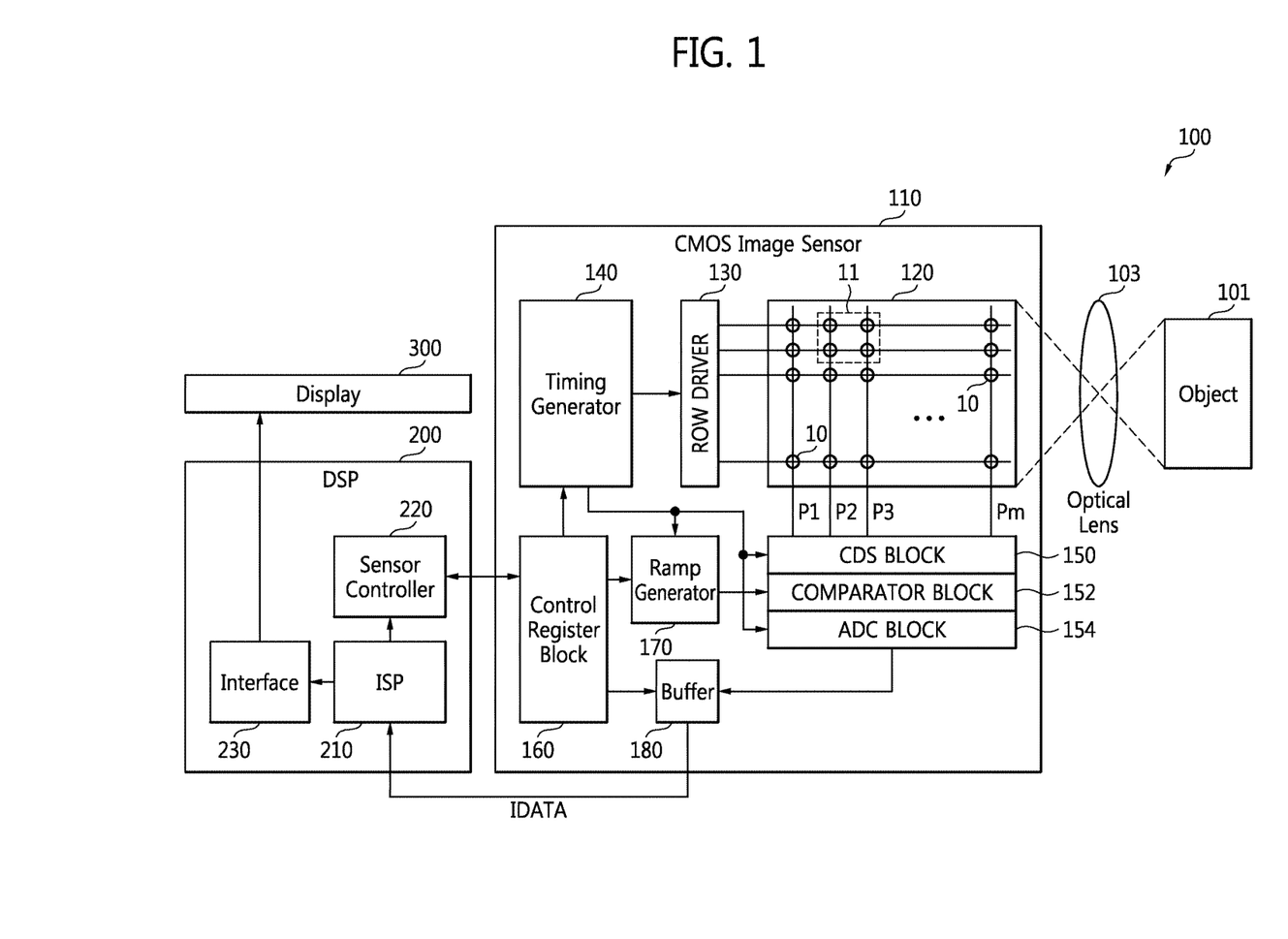
FIG. 1 is a schematic block diagram of an image processing system according to an exemplary embodiment.

FIG. 1 is a schematic block diagram of an image processing system 100 according to an exemplary embodiment. The image processing system 100 may be implemented as a portable electronic device such as a laptop computer, a cellular phone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a mobile internet device (MID), a wearable computer, an internet of things (IoT) device, or an internet of everything (IoE) device. The image processing system 100 includes an optical lens 103, an image sensor 110, a digital signal processor (DSP) 200, and a display 300.

The image sensor 110 generates image data IDATA corresponding to an object 101 picked up or captured by the optical lens 103. The image sensor 110 may be implemented as a complementary metal-oxide-semiconductor (CMOS) image sensor or a CMOS image sensor chip. The image sensor 110 may have a backside illumination (BSI) structure or a frontside illumination (FSI) structure.

The image sensor 110 may include a pixel array (or an active pixel sensor (APS) array) 120, a row driver 130, a timing generator 140, a correlated double sampling (CDS) block 150, a comparator block 152, an analog-to-digital conversion (ADC) block 154, a control register block 160, a ramp generator 170, and a buffer 180. The image sensor 110 illustrated in FIG. 1 is an example provided for clarity of the description and detailed components may be modified by manufacturers.

The pixel array 120 includes a plurality of pixels 10 arranged in a matrix. The structure and the operations of each pixel 10 will be described in detail with reference to FIGS. 1 through 6 below.

The row driver 130 may transmit a plurality of control signals for controlling the operations of the pixels 10 to the pixel array 120 according to the control of the timing generator 140. The row driver 130 may control the operations of the pixels by rows.

The timing generator 140 may control the operations of the row driver 130, the CDS block 150, the ADC block 154, and the ramp generator 170 according to the control of the control register block 160. The CDS block 150 may perform CDS on pixel signals P1 through Pm (where "m" is a natural number) respectively output from a plurality of column lines formed in the pixel array 120. The comparator block 152 may compare a plurality of correlated double sampled pixel signals output from the CDS block 150 with a ramp signal output from the ramp generator 170 and may output a plurality of comparison signals according to the comparison result.

The ADC block 154 may convert each of the comparison signals output from the comparator block 152 into a digital signal and may output digital signals to the buffer 180. The control register block 160 may control the operations of the timing generator 140, the ramp generator 170, and the buffer 180 according to the control of the DSP 200.

The buffer 180 may transmit the image data IDATA corresponding to the digital signals output from the ADC block 154 to the DSP 200. The DSP 200 includes an image signal processor (ISP) 210, a sense controller 220, and an interface 230. The DSP 200 may function as a process that can control the operations of the image sensor 110.

The ISP 210 may control the sensor controller 220, which controls the control register block 160, and the interface 230. The image sensor 110 and the DSP 200 may be implemented in respective chips in a package, e.g., a multi-chip package (MCP). Alternatively, the image sensor 110 and the ISP 210 may be implemented in respective chips in a package, e.g., an MCP.

The ISP 210 may process the image data IDATA received from the buffer 180 and may transmit processed image data to the interface 230. The sensor controller 220 may generate various control signals for controlling the control register block 160 according to the control of the ISP 210.

The interface 230 may transmit the image data processed by the ISP 210 to the display 300. The display 300 may display the image data received from the interface 230. The display 300 may be implemented as a thin film transistor-liquid crystal display (TFT-LCD), a light emitting diode (LED) display, an organic LED (OLED) display, or an active-matrix OLED (AMOLED) display.

Figure 2:
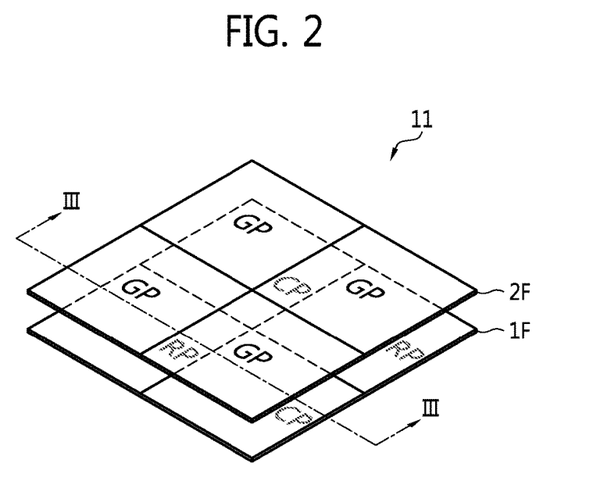
FIG. 2 is a plan view of 2*2 pixels included in a pixel array illustrated in FIG. 1.

FIG. 2 is a plan view of 2×2 pixels 11 included in the pixel array 120 illustrated in FIG. 1. For clarity of the description, 2×2 pixels 11 included in the pixel array 120 is illustrated in FIG. 2. A first layer (or a lower layer) 1F includes a plurality of pixels RP and CP. A red pixel RP on the first layer 1F includes a red color filter and a cyan pixel CP on the first layer 1F includes a cyan color filter.

A second layer (or an upper layer) 2F stacked on the first layer 1F includes a plurality of organic pixels GP. The organic pixels GP may include an organic photoelectric conversion layer that absorbs wavelengths in the green range.

As shown in FIG. 2, a structure including the first and second layers 1F and 2F may correspond to a 2×2 structure or an optical stack structure of an organic CMOS image sensor.

Figure 3:
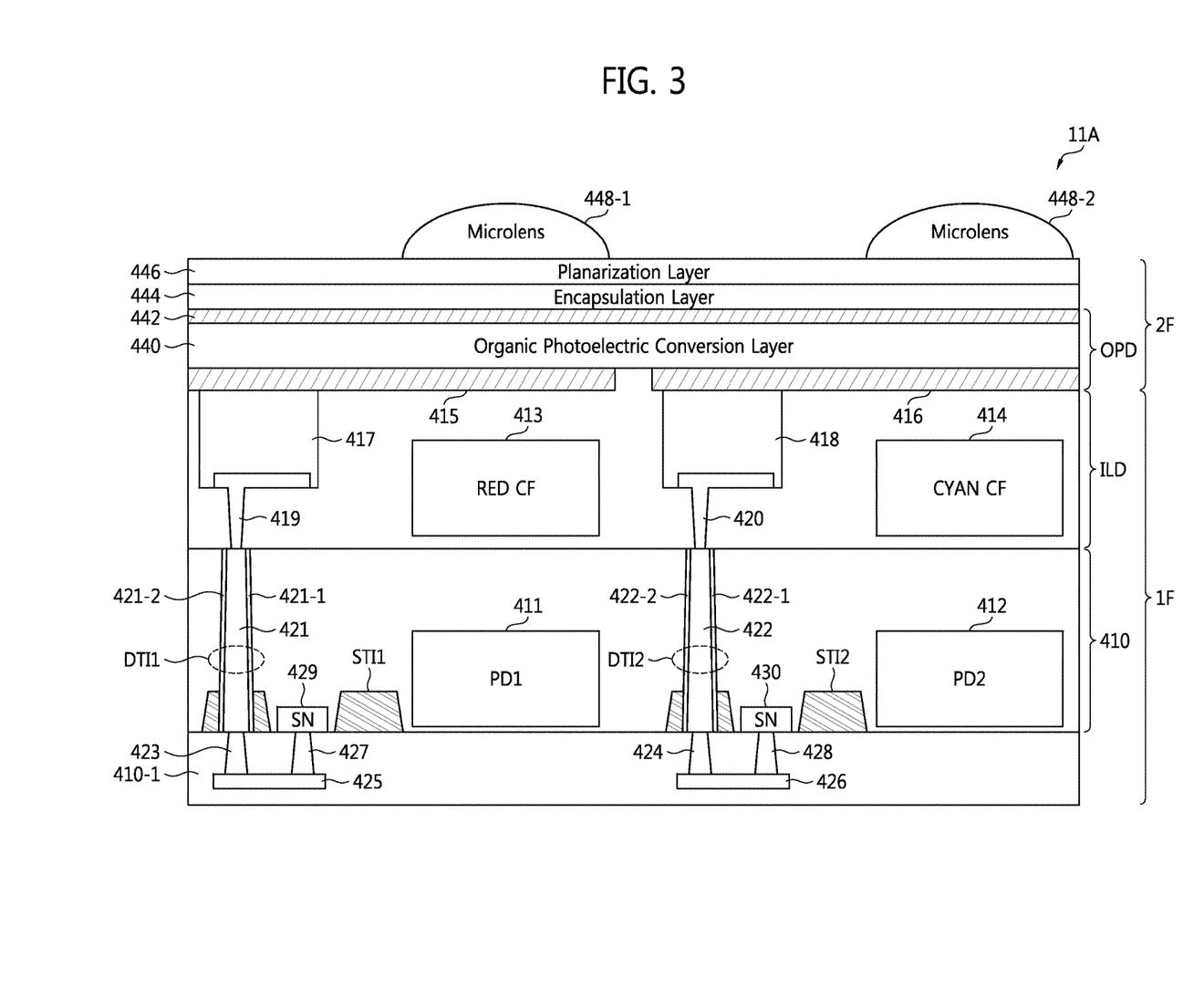
FIG. 3 is a cross sectional view of the pixels, taken along the line III-III illustrated in FIG. 2.

FIG. 3 is a cross sectional view of 2×2 pixels 11A, taken along the line III-III illustrated in FIG. 2. Referring to FIGS. 1 through 3, the 2×2 pixels 11A include a first photoelectric conversion element 411 and a second photoelectric conversion element 412 formed in a semiconductor substrate 410. The first and second photoelectric conversion elements 411 and 412 each may be implemented as a photodiode, a phototransistor, a photogate, or a pinned photodiode.

A red color filter 413 may be formed on or over the first photoelectric conversion element 411. Accordingly, wavelengths in the red range that have passed through the red color filter 413 are input to the first photoelectric conversion element 411 and the first photoelectric conversion element 411 generates charges in response to the wavelengths in the red range.

A cyan color filter 414 may be formed on or over the second photoelectric conversion element 412. Accordingly, wavelengths in the blue range that have passed through the cyan color filter 414 are input to the second photoelectric conversion element 412 and the second photoelectric conversion element 412 generates charges in response to the wavelengths in the blue range. For example, the red color filter 413 and the cyan color filter 414 may be formed in an interlayer dielectric (ILD) layer.

An organic photoelectric conversion layer 440 that absorbs wavelengths in the green range of the visible spectrum is formed over the red color filter 413 and the cyan color filter 414.

A first deep trench isolation (DTI) DTI1 may be formed between the first photoelectric conversion element 411 and a third photoelectric conversion element (not shown). The structure and the operations of the third photoelectric conversion element may substantially the same as those of the second photoelectric conversion element 412.

The first DTI DTI1 may be a front DTI (FDTI). A shallow trench isolation (STI) may be formed around the first DTI DTI1. STIs are marked with hatched lines in FIG. 3. Cross-talk between adjacent pixels or adjacent photoelectric conversion elements may be prevented due to DTI and/or STI.

A first conductive plug 421 is formed in the first DTI DTI1. Insulators 421-1 and 421-2 fully wrap around the first conductive plug 421. For example, the first conductive plug 421 may be formed of polysilicon.

A first storage node 429 may be formed between the first DTI DTI1 and a first STI STI1 or may be formed between STIs. The first STI STI1 may be formed between the first storage node 429 and the first photoelectric conversion element 411. The first conductive plug 421 and the first storage node 429 may be electrically connected with each other through a plurality of metals 423, 427, and 425. For example, the metals 423 and 427 may be formed of tungsten.

A second DTI DTI2 is formed between the first photoelectric conversion element 411 and the second photoelectric conversion element 412. The second DTI DTI2 may be an FDTI. An STI may be formed around the second DTI DTI2. The DTIs DTI1 and DTI2 each may be a back DTI (BDTI). A second conductive plug 422 is formed in the second DTI DTI2. Insulators 422-1 and 422-2 fully wrap around the second conductive plug 422. For example, the second conductive plug 422 may be formed of polysilicon.

A second storage node 430 may be formed between the second DTI DTI2 and a second STI STI2. The second STI STI2 may be formed between the second storage node 430 and the second photoelectric conversion element 412.

The second conductive plug 422 and the second storage node 430 may be electrically connected with each other through a plurality of metals 424, 428, and 426. The metals 424 and 428 may be formed of tungsten. For example, the metals 425 and 426 may be formed of the same material. The elements 423, 424, 425, 426, 427, and 428 may be formed in a readout circuit region 410-1. The elements 423, 424, 425, 426, 427, and 428 may be formed using deposition.

The readout circuit region 410-1 may be a metal wiring region. The structure illustrated in FIG. 3 is the BSI structure, but the inventive concept is not restricted to this BSI structure. The region other than the readout circuit region 410-1 may be formed in the FSI structure.

At least one first transistor that reads out charges stored in each of the storage nodes 429 and 430, at least one second transistor that reads out charges generated by the first photoelectric conversion element 411, and at least one third transistor that reads out charges generated by the second photoelectric conversion element 412 may be formed in the readout circuit region 410-1. Accordingly, the readout circuit region 410-1 may be broadly interpreted as a region in which the least one first transistor, the least one second transistor, and the least one third transistor are formed.

A bottom electrode 415 may be formed over the red color filter 413. The bottom electrode 415 may be implemented as a transparent electrode, which may be formed of indium tin oxide or tin-doped indium oxide (ITO). The bottom electrode 415 is connected to the organic photoelectric conversion layer 440. The bottom electrode 415 and the first conductive plug 421 may be connected to each other through metals 417 and 419. The metal 417 may be a backside metal and the metal 419 may be formed of tungsten. Accordingly, when appropriate voltages are applied to electrodes 415 and 442, charges generated at the organic photoelectric conversion layer 440 are transmitted to the first storage node 429 through the bottom electrode 415 and a first connection circuit.

The first connection circuit includes the metal 417 connected to the bottom electrode 415, the metal 419, the first conductive plug 421, and the metals 423, 425, and 427. At least one of the metals 419, 423, and 427 may be formed of tungsten.

A bottom electrode 416 may be formed over the cyan color filter 414. The bottom electrode 416 may be implemented as a transparent electrode, which may be formed of ITO. The bottom electrode 416 is connected to the organic photoelectric conversion layer 440. The bottom electrode 416 and the second conductive plug 422 may be connected to each other through metals 418 and 420. The metal 418 may be a backside metal and the metal 420 may be formed of tungsten. Accordingly, when appropriate voltages are applied to the electrodes 416 and 442, charges generated at the organic photoelectric conversion layer 440 are transmitted to the second storage node 430 through the bottom electrode 416 and a second connection circuit.

The second connection circuit includes the metal 418 connected to the bottom electrode 416, the metal 420, the second conductive plug 422, and the metals 424, 426, and 428. At least one of the metals 420, 424, and 428 may be formed of tungsten.

The bottom electrodes 415 and 416 may be isolated from each other. For example, the elements 413, 414, 417, 418, 419, and 420 may be formed in the ILD layer.

The organic photoelectric conversion layer 440 is formed between the top electrode 442 and the bottom electrodes 415 and 416. The top electrode 442 may be implemented as a transparent electrode, which may be formed ITO. The upper electrode 442 may function as a common electrode. A voltage applied to the top electrode 442 may be different from a voltage applied to the bottom electrodes 415 and 416 according to kinds of materials contained in the organic photoelectric conversion layer 440 or dominant charges (e.g., electrons or holes) generated at the organic photoelectric conversion layer 440. In other words, a design may be configured to make the voltage applied to the top electrode 442 higher or lower than the voltage applied to the bottom electrodes 415 and 416.

The organic photoelectric conversion layer 440 may include both electron donating organic material and electron accepting organic material. The organic photoelectric conversion layer 440 may be formed of an organic material in which an electron donating organic material is mixed with an electron accepting organic material.

In an exemplary embodiment, the organic photoelectric conversion layer 440 may include a first organic layer and a second organic layer formed on the first organic layer. For example, the first organic layer may contain one material among an electron donating organic material and an electron accepting organic material and the second organic layer may contain the other material among them.

For instance, when the first organic layer is formed of one material (e.g., n-type organic material) among a p-type organic material and the n-type organic material, the second organic layer may be formed of the other material (i.e., the p-type organic material) among them. Accordingly, the first and second organic layers may form a hetero p-n junction. Here, the electron donating organic material may indicate a material that can produce a donor ion in response to light and the electron accepting organic material may indicate a material that can produce an acceptor ion in response to the light.

An organic photodiode OPD may include the top electrode 442, the organic photoelectric conversion layer 440, and the bottom electrodes 415 and 416. An encapsulation layer 444 may be formed on or above the top electrode 442. The encapsulation layer 444 may include a plurality of oxide films having different refractive indexes. Examples of the encapsulation layer 444 will be described with reference to FIGS. 4 and 5 later. A planarization layer 446 may be formed on or above the encapsulation layer 444.

A first microlens 448-1 is formed over the red color filter 413. Visible light that has passed through the first microlens 448-1 is incident on the organic photoelectric conversion layer 440 through the elements 446, 444, and 442.

Wavelengths in the green range of the visible light incident on the organic photoelectric conversion layer 440 are absorbed at the organic photoelectric conversion layer 440. When appropriate voltages are applied to the electrodes 415 and 442, charges are generated at the organic photoelectric conversion layer 440 in response to the wavelengths in the green range. As described above, the charges are transmitted to the first storage node 429 through the bottom electrode 415 and the first connection circuit. Wavelengths other than the wavelengths in the green range among the visible light passed through the organic photoelectric conversion layer 440 are input to the red color filter 413. The red color filter 413 transmits wavelengths only in the red range of the visible light to the first photoelectric conversion element 411. The first photoelectric conversion element 411 performs photoelectric conversion in response to the wavelengths in the red range.

A second microlens 448-2 is formed over the cyan color filter 414. Visible light that has passed through the second microlens 448-2 is incident on the organic photoelectric conversion layer 440 through the elements 446, 444, and 442.

Wavelengths in the green range of the visible light incident on the organic photoelectric conversion layer 440 are absorbed at the organic photoelectric conversion layer 440. In particular, wavelengths in the green range among wavelengths in the cyan range are absorbed at the organic photoelectric conversion layer 440. When appropriate voltages are applied to the electrodes 416 and 442, charges are generated at the organic photoelectric conversion layer 440 in response to the wavelengths in the green range. As described above, the charges are transmitted to the second storage node 430 through the bottom electrode 416 and the second connection circuit.

Wavelengths other than the wavelengths in the green range among the visible light passed through the organic photoelectric conversion layer 440 are input to the cyan color filter 414. In particular, wavelengths in the blue range other than the wavelengths in the green range among the wavelengths in the cyan range are input to the cyan color filter 414. The cyan color filter 414 transmits the wavelengths only in the blue range of the visible light to the second photoelectric conversion element 412. The second photoelectric conversion element 412 performs photoelectric conversion in response to the wavelengths in the blue range.

Figure 4:
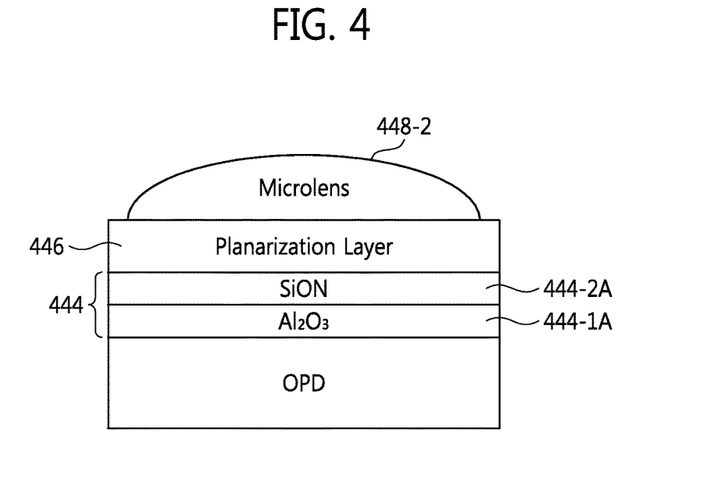
FIG. 4 is a diagram showing an encapsulation layer illustrated in FIG. 3 according to an exemplary embodiment.

FIG. 4 is a diagram showing the encapsulation layer 444 illustrated in FIG. 3 according to an exemplary embodiment. Referring to FIGS. 3 and 4, the encapsulation layer 444 includes a first oxide film 444-1A and a second oxide film 444-2A formed on the first oxide film 444-1A.

When a refractive index of the first oxide film 444-1A is "n2" and a refractive index of the second oxide film 444-2A is "n1", where n1>n2. For example, the first oxide film 444-1A may be formed of aluminum oxide, e.g., $Al_2O_3$; and the second oxide film 444-2A may be formed of silicon oxynitride (SiON).

Figure 5:
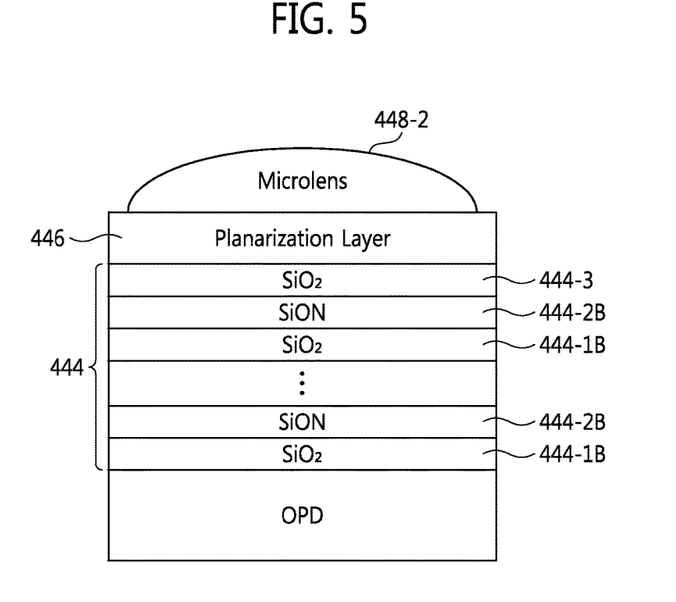
FIG. 5 is a diagram showing an encapsulation layer illustrated in FIG. 3 according to an exemplary embodiment.

FIG. 5 is a diagram showing the encapsulation layer 444 illustrated in FIG. 3 according to an exemplary embodiment. Referring to FIGS. 3 and 5, the encapsulation layer 444 includes a third oxide film 444-1B and a fourth oxide film 444-2B formed on the third oxide film 444-1B.

When the third oxide film 444-1B and the fourth oxide film 444-2B form a pair, at least two pairs are stacked. A fifth oxide film 444-3 which is the same as the third oxide film 444-1B is formed on the fourth oxide film 444-2B in the lastly stacked pair. When a refractive index of the third oxide film 444-1B is "n3" and a refractive index of the fourth oxide film 444-2B is "n1", where n1>n3. The oxide films 444-1B and 444-3 may be formed of silicon dioxide ($SiO_2$) and the fourth oxide film 444-2B may be formed of SiON.

Figure 6:
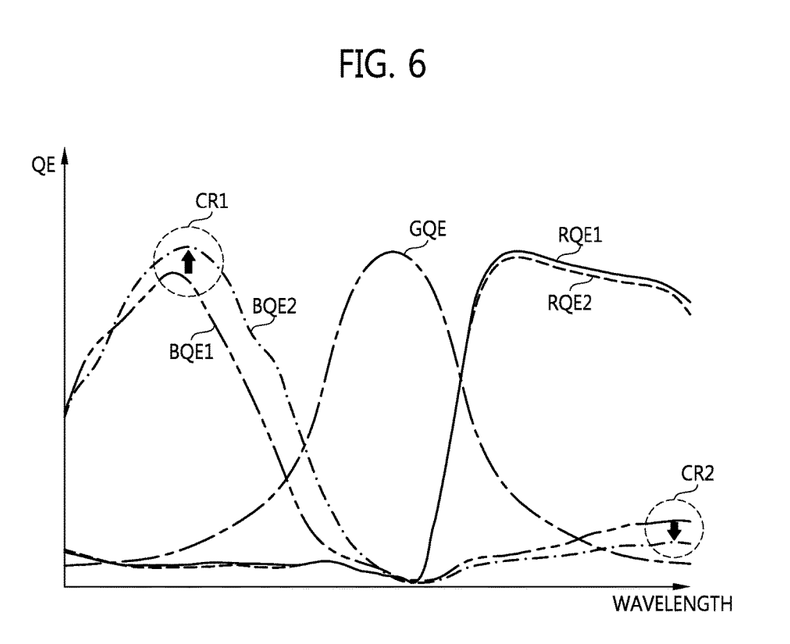
FIG. 6 is a graph illustrating the quantum efficiency of a conventional G/RB structure and the quantum efficiency of a G/CR structure in an exemplary embodiment.

FIG. 6 is a graph illustrating the quantum efficiency of a conventional G/RB structure and the quantum efficiency of a G/CR structure in an exemplary embodiment. The G/RB structure has a first layer in which a red color filter and a blue color filter are formed and a second layer which is stacked on the first layer and which includes an organic photoelectric conversion layer that absorbs the wavelengths in the green range. The G/CR structure has, as shown in FIGS. 2 and 3, the first layer 1F in which the red color filter 413 and the cyan color filter 414 are formed and the second layer 2F which is stacked on the first layer 1F and which includes the organic photoelectric conversion layer 440 that absorbs the wavelengths in the green range.

Curves BQE1, GQE, and RQE1 shown in FIG. 6 represent quantum efficiency (QE) of the conventional G/RB structure with respect to the wavelengths in the blue range, QE with respect to the wavelengths in the green range, and QE with respect to the wavelengths in the red range, respectively. Curves BQE2 and RQE2 represent QE of the G/CR structure according to an exemplary embodiment with respect to the wavelengths in the blue range and QE with respect to the wavelengths in the red range, respectively. When the curves BQE1 and BQE2 are compared with each other, sensitivity to the blue range is significantly enhanced, as shown in a first circle CR1, and cross-talk is reduced, as shown in a second circle CR2, in the exemplary embodiments.

Figure 7:
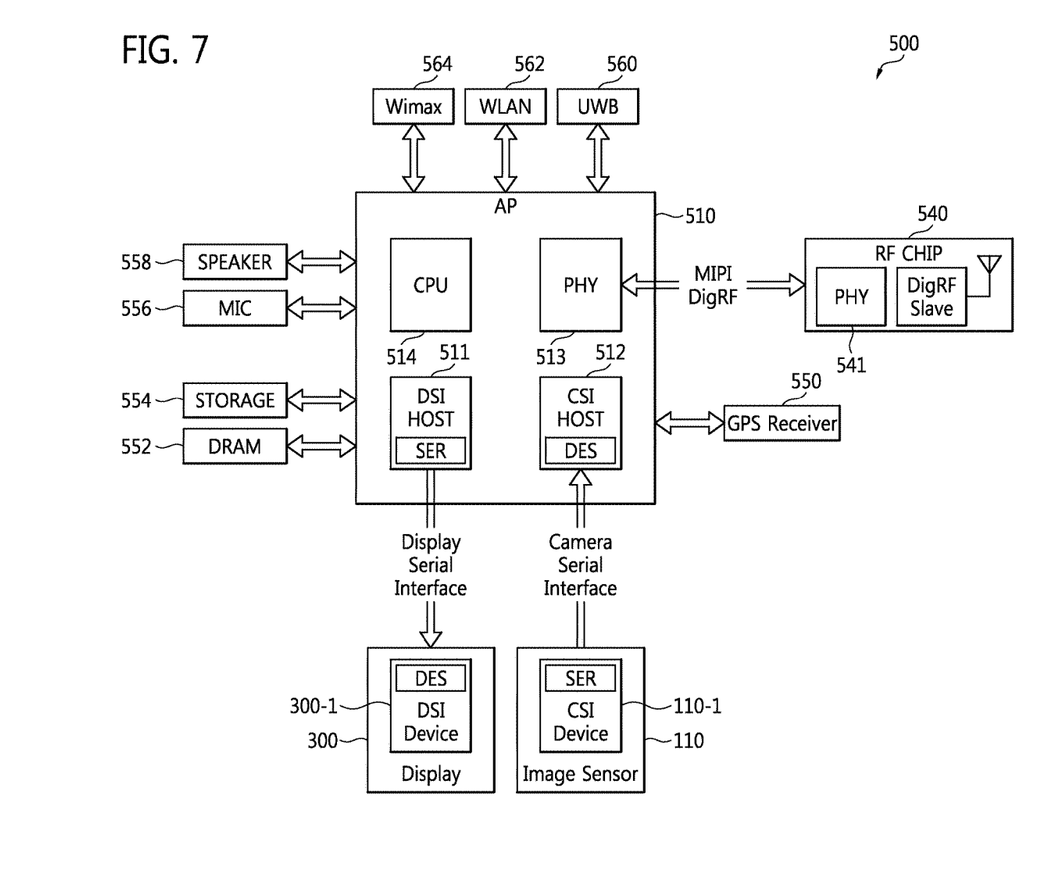
FIG. 7 is a schematic block diagram of an image processing system according to an exemplary embodiment.

FIG. 7 is a schematic block diagram of an image processing system 500 according to an exemplary embodiment Referring to FIGS. 1 through 7, the image processing system 500 may use or support mobile industry processor interface (MIPI).

Like the image processing system 100 illustrated in FIG. 1, the image processing system 500 may be implemented as a portable electronic device. The image processing system 500 includes an application processor (AP) 510, the image sensor 110, and the display 300.

A camera serial interface (CSI) host 512 in the AP 510 may perform serial communication with a CSI device 110-1 in the image sensor 110 through CSI. A deserializer DES and a serializer SER may be included in the CSI host 512 and the CSI device 110-1, respectively. The image sensor 110 may be an image sensor that has the G/CR structure described with reference to FIGS. 1 through 6.

A display serial interface (DSI) host 511 in the AP 510 may perform serial communication with a DSI device 300-1 in the display 300 through DSI. A serializer SER and a deserializer DES may be included in the DSI host 511 and the DSI device 300-1, respectively. The serializers SER and the deserializers DES may transfer electrical signals or optical signals. The image processing system 500 may also include a radio frequency (RF) chip 540 communicating with the AP 510. A physical layer (PHY) 513 in the AP 510 and a PHY 541 in the RF chip 540 may communicate data with each other according to MIPI DigRF.

A central processing unit (CPU) 514 in the AP 510 may control the operations of the DSI host 511, the CSI host 512, and the PHY 513. The CPU 514 may include at least one core. The AP 510 may be implemented in an integrated circuit (IC) or a system on chip (SoC). The AP 510 may be a processor or a host that can control the operations of the image sensor 110.

The image processing system 500 may further include a global positioning system (GPS) receiver 550, a volatile memory 552 such as dynamic random access memory (DRAM), a data storage 554 formed using non-volatile memory such as flash-based memory, a microphone (MIC) 556, and/or a speaker 558. The data storage 554 may be implemented as an external memory detachable from the AP 510. The data storage 554 may also be implemented as a universal flash storage (UFS), a multimedia card (MMC), an embedded MMC (eMMC), or a memory card.

The image processing system 500 may communicate with external devices using at least one communication protocol or standard, e.g., ultra-wideband (UWB) 560, wireless local area network (WLAN) 562, worldwide interoperability for microwave access (Wimax) 564, or long term evolution (LTE) (not shown). In an exemplary embodiment, the image processing system 500 may also include a near field communication (NFC) module, a WiFi module, or a Bluetooth module.

As described above, according to an exemplary embodiment, an image sensor enhances the sensitivity to the blue range of the visible light and reduces cross-talk.

While exemplary embodiments have been particularly shown and described with reference to drawings, it will be understood by those of ordinary skill in the art that various changes in forms and details may be made therein without departing from the spirit and scope of the inventive concept as defined by the following claims.

What is claimed is:

1. An image sensor comprising:
a first photoelectric conversion element and a second photoelectric conversion element, which are formed in a semiconductor substrate;
a red color filter formed on the first photoelectric conversion element;
a cyan color filter formed on the second photoelectric conversion element;
an organic photoelectric conversion layer formed on the red color filter and the cyan color filter, the organic photoelectric conversion layer configured to absorb wavelengths in a green range;
a first oxide film formed on the organic photoelectric conversion layer, the first oxide film configured to have a first refractive index; and
a second oxide film formed on the first oxide film, the second oxide film configured to have a second refractive index,
wherein the first refractive index is less than the second refractive index.

2. The image sensor of claim 1, wherein the first oxide film comprises $Al_2O_3$ and the second oxide film comprises SiON.

3. The image sensor of claim 1, wherein the first oxide film and the second oxide film form a pair of films and at least two pairs of films are stacked.

4. The image sensor of claim 1, further comprising a third oxide film formed on the second oxide film, the third oxide film configured to have the first refractive index.

5. The image sensor of claim 4, wherein the first oxide film and the third oxide film comprises $SiO_2$ and the second oxide film comprises SiON.

6. The image sensor of claim 1, further comprising:
a planarization layer formed on the organic photoelectric conversion layer; and
a plurality of oxide films formed between the organic photoelectric conversion layer and the planarization layer,
wherein the oxide films have different refractive indexes.

7. The image sensor of claim 1, further comprising:
a transparent electrode connected to the organic photoelectric conversion layer;
a storage node formed in the semiconductor substrate; and
a connection circuit configured to connect the transparent electrode with the storage node.

8. The image sensor of claim 7, wherein the connection circuit comprises:
a first metal connected to the transparent electrode;
a deep trench isolation (DTI) comprising a conductive plug therein;
a second metal; and
a plurality of third metals configured to connect the first metal, the conductive plug, the second metal, and the storage node in series to one another.

9. The image sensor of claim 8, further comprising a shallow trench isolation (STI) formed between the storage node and one from among the first photoelectric conversion element and the second photoelectric conversion element.

10. The image sensor of claim 1, further comprising:
a deep trench isolation (DTI) formed between the first photoelectric conversion element and the second photoelectric conversion element; and
a shallow trench isolation (STI) formed between the DTI and the second photoelectric conversion element.

11. The image sensor of claim 10, wherein the DTI comprises a conductive plug formed therein.

12. The image sensor of claim 11, wherein the conductive plug comprises polysilicon.

13. An image processing system comprising:
an image sensor configured to output image data; and
a processor configured to process the image data,
wherein the image sensor comprises:
a first photoelectric conversion element and a second photoelectric conversion element, which are formed in a semiconductor substrate;
a red color filter formed on the first photoelectric conversion element;
a cyan color filter formed on the second photoelectric conversion element;
an organic photoelectric conversion layer formed on the red color filter and the cyan color filter, the organic photoelectric conversion layer configured to absorb wavelengths in a green range;
a first oxide film formed on the organic photoelectric conversion layer, the first oxide film configured to have a first refractive index; and
a second oxide film formed on the first oxide film, the second oxide film configured to have a second refractive index,
wherein the first refractive index is less than the second refractive index.

14. The image processing system of claim 13, further comprising a camera serial interface configured to transmit the image data from the image sensor to the processor.

15. The image processing system of claim 13, wherein the image sensor further comprises a third oxide film formed on the second oxide film, the third oxide film configured to have the first refractive index.

16. The image processing system of claim 13, wherein the image sensor further comprises:
a deep trench isolation (DTI) formed between the first photoelectric conversion element and the second photoelectric conversion element, the DTI comprising a conductive plug formed therein; and
a shallow trench isolation (STI) formed between the DTI and the second photoelectric conversion element.

17. The image processing system of claim 13, wherein the image sensor further comprises:
a transparent electrode connected to the organic photoelectric conversion layer;
a first metal connected to the transparent electrode;
a deep trench isolation (DTI) comprising a conductive plug therein;
a second metal;
a storage node formed in the semiconductor substrate; and
a plurality of third metals configured to connect the first metal, the conductive plug, the second metal, and the storage node in series to one another.

18. The image processing system of claim 17, wherein at least one of the third metals comprises tungsten.

* * * * *